US012082378B2

(12) United States Patent
Magi et al.

(10) Patent No.: US 12,082,378 B2
(45) Date of Patent: Sep. 3, 2024

(54) THERMALLY CONDUCTIVE SHOCK ABSORBERS FOR ELECTRONIC DEVICES

(71) Applicant: Intel Corporation, Santa Clara, CA (US)

(72) Inventors: Aleksander Magi, Portland, OR (US); Jeff Ku, Taipei (TW); Juha Paavola, Hillsboro, OR (US); Prakash Kurma Raju, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 656 days.

(21) Appl. No.: 17/131,137

(22) Filed: Dec. 22, 2020

(65) Prior Publication Data

US 2021/0112685 A1 Apr. 15, 2021

(51) Int. Cl.
*H05K 7/20* (2006.01)
*F16F 7/12* (2006.01)

(52) U.S. Cl.
CPC ......... *H05K 7/20454* (2013.01); *F16F 7/128* (2013.01); *F16F 2222/025* (2013.01); *F16F 2230/0023* (2013.01); *F16F 2230/48* (2013.01)

(58) Field of Classification Search
CPC .. F28F 2255/02; F28F 13/00; F28F 2013/006; G06F 1/20; H01L 23/373; H05K 7/20454; H05K 7/2049; A47C 27/081; G11B 33/08; G11B 33/1426
See application file for complete search history.

(56) References Cited

U.S. PATENT DOCUMENTS

| 5,777,847 A * | 7/1998 | Tokuno ............... H01L 23/3675 257/713 |
| 2004/0032710 A1* | 2/2004 | Fujiwara ............... G06F 1/1616 |
| 2005/0013117 A1* | 1/2005 | Barsun ............... H05K 7/20727 257/E23.099 |
| 2005/0093120 A1* | 5/2005 | Millik ................. H05K 1/0262 257/E23.101 |
| 2009/0244852 A1* | 10/2009 | Okada ................... H01L 23/433 361/721 |
| 2015/0301568 A1* | 10/2015 | Hill ........................... G06F 1/20 29/890.03 |
| 2015/0327353 A1* | 11/2015 | Dickover ............ H01L 23/4338 29/890.03 |
| 2016/0004284 A1 | 1/2016 | Cohen et al. |
| 2016/0351467 A1* | 12/2016 | Li .......................... H01L 23/10 |

(Continued)

OTHER PUBLICATIONS

European Patent Office, "Search Report", issued in connection with European Patent Application No. 21198063.6 on Mar. 17, 2022, 11 pages.

(Continued)

*Primary Examiner* — Michael A Matey
(74) *Attorney, Agent, or Firm* — Hanley, Flight & Zimmerman, LLC

(57) ABSTRACT

Thermally conductive shock absorbers for electronic devices are disclosed. An electronic device includes a housing and a hardware component positioned inside the housing. A thermally conductive shock absorber is located between an inner surface of the housing and the hardware component. The thermally conductive shock absorber including an impact absorbing material and a thermal conductive material being in contact with at least a portion of the impact absorbing material.

20 Claims, 7 Drawing Sheets

(56) References Cited

U.S. PATENT DOCUMENTS

| | | | |
|---|---|---|---|
| 2017/0083061 A1* | 3/2017 | Stellman | H01L 23/467 |
| 2018/0110158 A1* | 4/2018 | Talpallikar | H05K 9/009 |
| 2019/0041922 A1* | 2/2019 | Kurma Raju | H05K 7/2039 |
| 2019/0221237 A1 | 7/2019 | Cheng | |
| 2020/0089292 A1* | 3/2020 | North | G06F 1/206 |
| 2020/0118906 A1* | 4/2020 | Cola | F16J 15/104 |
| 2021/0153340 A1* | 5/2021 | Lee | G06F 1/184 |
| 2022/0167526 A1* | 5/2022 | Xu | H05K 7/20418 |
| 2023/0156900 A1* | 5/2023 | Cavallaro | G06F 1/203 |
| | | | 361/679.54 |

OTHER PUBLICATIONS

European Patent Office, Communication Pursuant to Article 94(3) EPC, issued in connection with EP Patent Application No. 21 198 063.6 on Jun. 25, 2024, 5 pages.

* cited by examiner

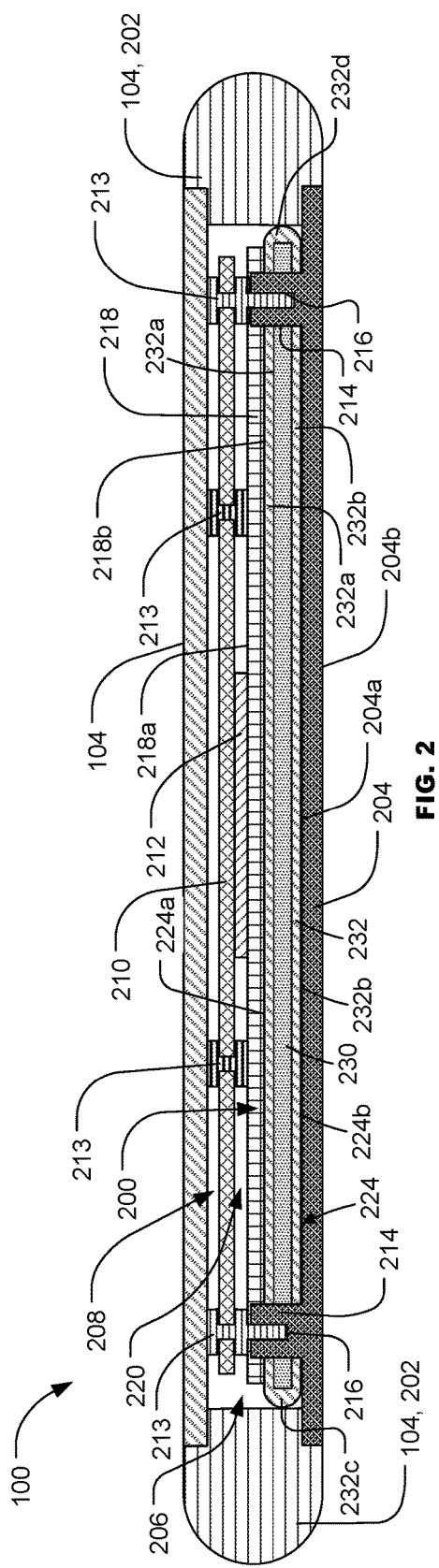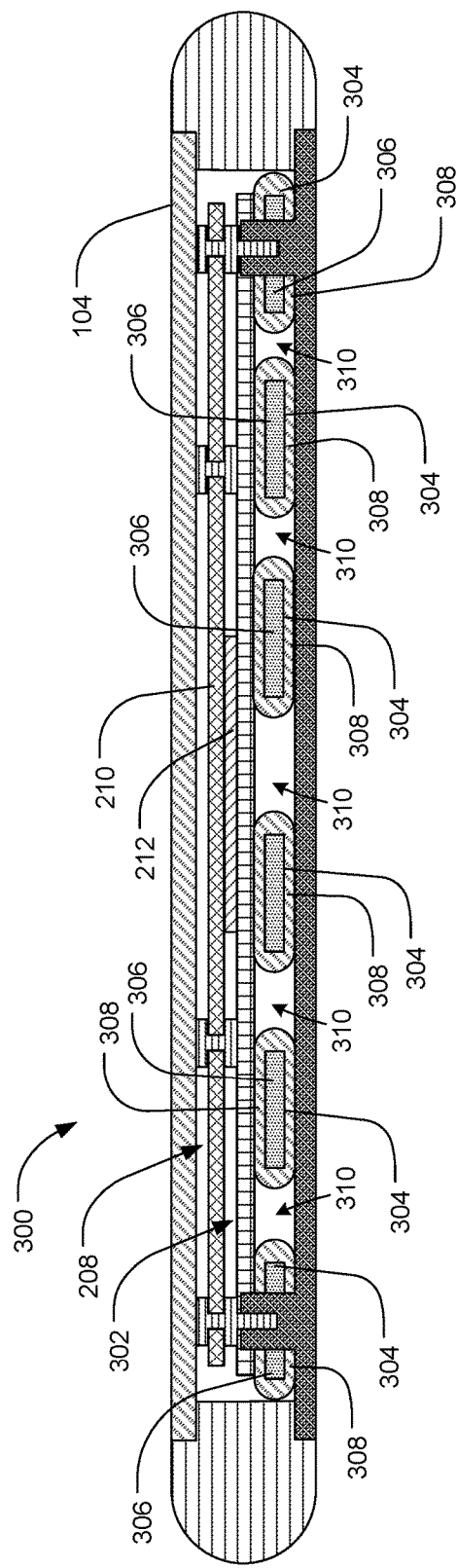

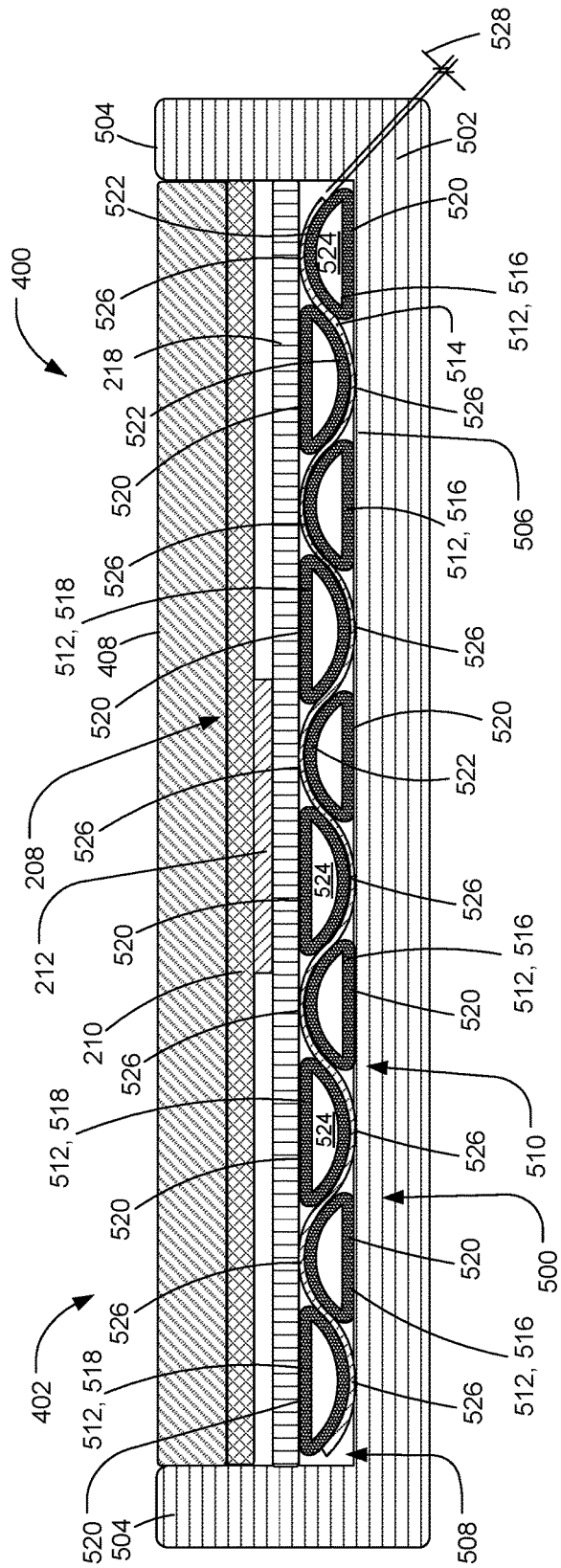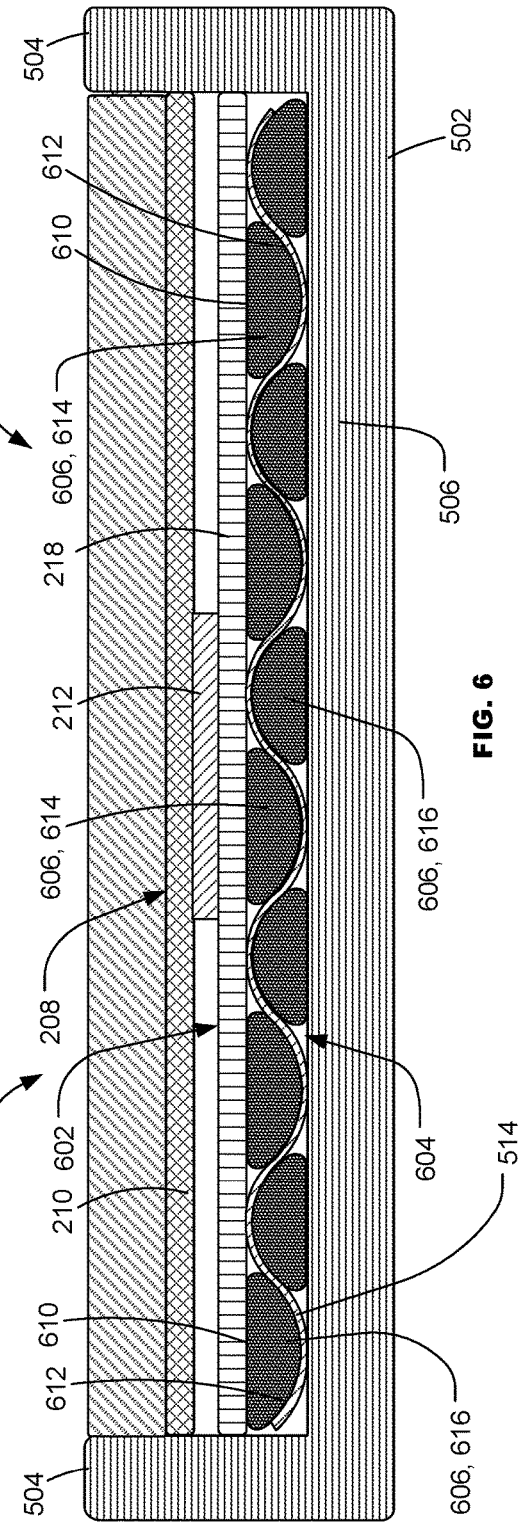

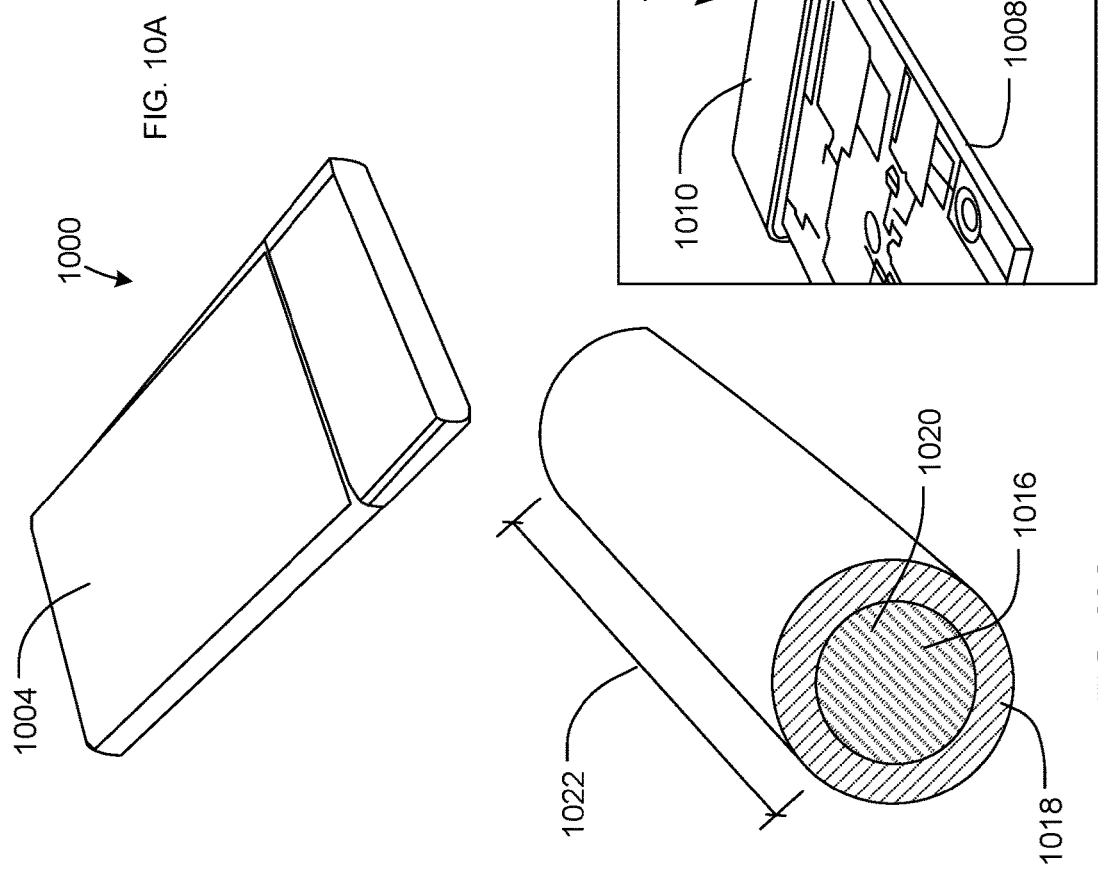

THERMALLY CONDUCTIVE SHOCK ABSORBERS FOR ELECTRONIC DEVICES

FIELD OF THE DISCLOSURE

This disclosure relates generally to hardware and/or software attacks, and, more particularly, to thermally conductive shock absorbers for electronic devices.

BACKGROUND

Electronic devices require thermal systems to manage thermal conditions for maintaining optimal efficiency. To manage thermal conditions, electronic devices employ thermal cooling systems that cool electronic components of the electronic devices during use.

BRIEF DESCRIPTION OF THE DRAWINGS

FIG. 2 is a cross-sectional view of the example electronic device of FIG. 1 taken along line 2-2 of FIG. 1.

FIG. 3 is a cross-sectional view of another example electronic device having another example thermal management system disclosed herein.

FIG. 5 is a cross-sectional view of the example electronic device of FIG. 4 taken along line 5-5 of FIG. 4.

FIG. 6 is a cross-sectional view of another example electronic device having another example thermal management system disclosed herein.

FIG. 10A illustrates another example electronic device having another example thermal management system disclosed herein.

FIG. 10B is a partially exploded view of the example electronic device of FIG. 10A.

FIG. 10C is a partial cross-sectional, perspective view of an example thermally conductive shock absorber of the example thermal management system of FIG. 10B.

Figure 1:
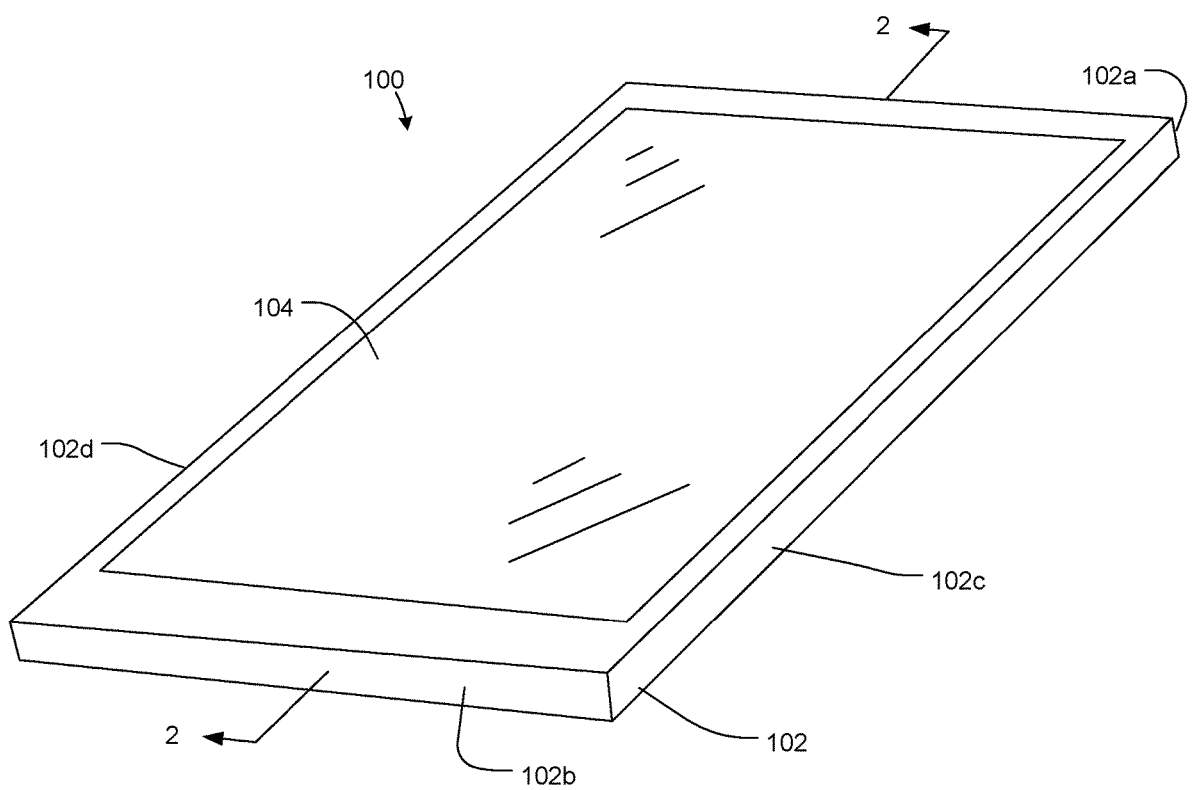
FIG. 1 is an example electronic device having an example thermal management system constructed in accordance with teachings of this disclosure.

The figures are not to scale. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

During operation of an electronic device (e.g., a laptop, a tablet, etc.), hardware components disposed in a body or housing of the device, such as a processor, graphics card, and/or battery, generate heat. Heat generated by the hardware components of the electronic device can cause a temperature of one or more electronic components to exceed operating temperature limits of the one or more electronic components. In some instances, heat generated by the electronic device can cause portions of an exterior surface, or skin, of a device housing to increase and become warm or hot to a user's touch.

To prevent overheating of the hardware components, damage to the device, and/or discomfort to the user of the device when the user touches or places one or more portions of the user's body proximate to the skin of the device and/or components of the device accessible via the exterior surface of the housing such as a touchpad, the electronic device includes a thermal management system to dissipate heat from the electronic device. Example thermal systems include active cooling systems or passive cooling systems. Passive cooling systems are often employed with processors that do not exceed approximately 10 watts of power. Processors that exceed 10 watts of power often require active cooling systems to effectively cool these processors below desired operating temperatures.

Active cooling systems employ forced convention methods to increase a rate of fluid flow, which increases a rate of heat removal. For example, to exhaust heat or hot air generated within the body of the electronic device and cool the electronic device, active cooling systems often employ external devices such as fans or blowers, forced liquid, thermoelectric coolers, etc. In known electronic devices, operation of the fan(s) of the electronic device and/or management of power consumed by the device are controlled based on the thermal constraint(s). For instance, if a temperature of a hardware component of the device is approaching a maximum temperature as defined by the thermal constraint for the component, rotational speed(s) (e.g., revolutions per minute (RPMs)) of the fan(s) can be increased to exhaust hot air and reduce a temperature of the component. However, operation of the fan(s) at higher speeds increases audible acoustic noise generated by the fan(s). In some known electronic devices, the fan speed(s) and, thus, the amount of cooling that is provided by the fan(s), can be restricted to avoid generating fan noise levels over certain decibels (e.g., a maximum noise level of 35 dBA during operation of the fan(s)). As a result of the restricted fan speed(s), performance of the device may be limited to enable the fan(s) to cool the user device within the constraints of the fan speed(s). Further, active cooling systems require additional space requirements and/or use of electricity, which results in a larger housing form factor and/or higher manufacturing costs.

Passive cooling systems employ natural convection and heat dissipation by utilizing heat spreaders or heat sinks to increase (e.g., maximize) radiation and convection heat transfer. For instance, passive cooling systems do not employ external devices such as fans or blowers that would otherwise force airflow to exhaust heat from the housing of the electronic device. Instead, passive cooling systems relay on material characteristic(s) to provide heat transfer pathways between electronic components and outer surfaces or skins of the electronic devices. Passive cooling systems are significantly less expensive than active cooling systems, do not require power to operate, and provide space saving benefits.

Some example electronic devices (e.g., laptops, tablets, etc.) offer improved ruggedness for student use, businesses, construction sites, etc. Rugged electronic devices employ chassis having thicker wall structure to protect electronic components within the frame from mechanical impacts and/or shocks. Thus, rugged-type electronic devices are structurally improved to increase impact resistance and, thus, decrease damage to electronic components when, for example, the electronic device is dropped. To increase a strength of the frame, the chassis of a rugged electronic devices employ wall structures typically between 2 millimeters and 8 millimeters. However, increased wall structures provide thermal challenges for passive cooling systems given the increased thickness of the frame reduces thermal conductively. Thus, low cost thermal solution provided by passive cooling systems are often not effective for rugged-type electronic devices. Such devices often require use of active thermal systems to cool the electronic components, which significantly increase manufacturing costs.

Example apparatus disclosed herein provide passive cooling in combination with impact resistance. An example passive cooling system disclosed herein provides a physical heat transfer path between one or more electronic components of and electronic device and one or more outer skins of the electronic device, and a shock absorber material between the electronic components and the outer skin. An example heat transfer path disclosed herein can be formed by having heat transfer material (e.g., a graphite sheet) physically or mechanically coupling electronic components of the electronic device and an outer skin of the electronic device. Additionally, an example impact resistant material of the illustrated example is positioned between the electronic components and the outer skin to protect the electronic components from damage that may be caused by impacts. Example electronic components (e.g. motherboard, battery, etc.), passive cooling systems, frames, and outer skins of electronic devices disclosed herein provide a sandwich structure (e.g. a very stiff sandwich structure) that provides heat transfer capability and strong structure against mechanical impacts. Some example passive cooling systems disclosed herein provide an impact resistant material encased within a heat transfer material. Some example passive cooling systems disclosed herein provide a plurality of impact restrict materials encased with a plurality of heat transfer materials. Some example passive cooling systems disclosed herein provide heat transfer material positioned between spaced apart heat transfer materials.

FIG. 1 is an example electronic device 100 constructed in accordance with teachings of this disclosure. The electronic device of the illustrated example is a personal computing device such as, for example, a tablet. The electronic device 100 of the illustrated example includes a housing 102 and a display 104. The housing 102 defines a first side wall 102a, a second wall 102b, a third side wall 102c and a fourth side wall 102d. The housing 102 houses one or more electronic components and carries the display 104. To enable user inputs, the display 104 of the illustrated example provides a graphical user input device, a virtual keyboard, a virtual trackpad, etc. Although the example electronic device 100 of the illustrated example is a tablet, in some examples, the electronic device 100 can be a laptop, a desktop, a mobile device, a cell phone, a smart phone, a hybrid or convertible PC, a personal computing (PC) device, a sever, a modular compute device, a digital picture frame, a graphic calculator, a smart watch, and/or any other electronic device that employs passive cooling.

FIG. 2 is a cross-section of the example electronic device 100 of FIG. 2 taken along line 2-2 of FIG. 1 and showing an example thermal management system 200 disclosed herein. The housing 102 of the illustrated example includes a frame 202 (e.g., a chassis) and a skin 204 (e.g., a bottom skin, an outer skin, a D-cover, etc.). The frame 202 and the skin 204 define a cavity 206 to receive one or more hardware components 208. The skin 204 and/or the display 104 of the illustrated example attaches to the frame 202 via an adhesive (e.g., glue). However, in some examples, the skin 204 of the illustrated example can attach to the frame 202 via a mechanical fastener such as, for example, a screw, a clip, a rivet, a chemical fastener such as, for example, glue, plastic welding, etc., and/or any other suitable fastener(s). In some examples, the skin 204 can be integrally formed with the frame 202. The frame 202 and/or the skin 204 of the illustrated example can be composed of plastic, magnesium, aluminum, a combination thereof, and/or any other material(s). In some examples, a wall thickness of the housing 102, the frame 202 and/or the skin 204 can be approximately between 2 millimeters and 8 millimeters.

The housing 102 of the illustrated example carries the hardware components 208. The hardware components 208 of the illustrated example include a printed circuit board (PCB) 210 coupled to a processor 212 (e.g., a system on chip (SOS)). The processor 212 of the illustrated example does not exceed 10 watts of power. However, in some examples, the processor 212 can exceed 10 watts of power. To couple the PCB 210 to the skin 204, the electronic device 100 of the illustrated example includes a plurality of fasteners 213 (e.g. standoffs, screws, etc.). Specifically, the skin 204 of the illustrated example includes one or more bosses 214 (e.g., cylindrical bosses) having apertures 216 to receive the fasteners 213. The bosses 214 of the illustrated example can be formed with or attached to the skin 204. Although not shown in the cross-sectional view of FIG. 2, the hardware components 208 of the illustrated example can include a graphics card, a battery, light emitting diodes, a speaker, a microphone, a camera, memory, a storage drive, etc.

To dissipate or spread heat generated by the hardware components 208 during operation of the electronic device 100, the thermal management system 200 of the illustrated example employs a heat sink or vapor chamber 218. The vapor chamber 218 of the illustrated example is a heat sink that includes a metal enclosure that is vacuum sealed and includes an internal wick structure attached to the inside walls of the enclosure that moves liquid around the vapor chamber 218 using capillary action to spread heat along a surface area (e.g., upper surface and a lower surface) of die vapor chamber 218. In some examples, the vapor chamber is a planar heat pipe, which can spread heat in two dimensions (e.g., across a surface area of the vapor chamber). The vapor chamber 218 of the illustrated example can be composed of brass, copper and/or any other suitable material(s) for transferring and/or spreading heat. The vapor chamber 218 of the illustrated example is coupled to the PCB 210 via the fasteners 213 (e.g., standoffs). The fasteners 213, although couple the PCB 210 to the vapor chamber 218, separate the PCB 210 from the vapor chamber 218 to provide a gap 220 for the processor 212. Thus, the processor 212 of the illustrated example is positioned (e.g., sandwiched) between the PCB 210 and the vapor chamber 218, and the vapor chamber 218 is positioned between the processor 212 and the skin 204. Additionally, the vapor chamber 218 is coupled to the skin 204 via the fasteners 213 and the bosses 214. Thus, fasteners 213 stack the PCB 210, the processor 212, the vapor chamber 218 and the skin 204. In some examples, the thermal management system 200 can employ a heat spreader, a heat sink, a heat pipe and/or any other heat spreading device in place of the vapor chamber 218.

To transfer heat from the vapor chamber to the housing 102, the thermal management system 200 of the illustrated example employs a thermally conductive shock absorber 224 (e.g., a passive cooling and impact resistance assembly). The thermally conductive shock absorber 224 of the illustrated example is positioned between the housing 102 and the hardware components 208. Specifically, the thermally conductive shock absorber 224 of the illustrated example is positioned (e.g., sandwiched) between the skin 204 and the vapor chamber 218. The thermally conductive shock absorber 224 of the illustrated example provides a thermally conductive cooling pathway for the electronic device 100. Specifically, the thermally conductive shock absorber 224 of the illustrated example directly couples the vapor chamber 218 and the skin 204. In other words, the thermally conductive shock absorber 224 of the illustrated example has a first side 224a directly engaged or in direct contact with a first side 216a of the vapor chamber 218 and a second side 224b directly engaged with or in direct contact with a first side 204a of the skin 204 (e.g., an inner side oriented toward the cavity 206). For reference, a second side 214b of the vapor chamber 218 opposite the first side 214a is oriented toward the processor 212 and the PCB 210. Additionally, a second side 204b of the skin 204 opposite the first side 204a defines a portion of an outer surface (e.g., a bottom surface) of the housing 102.

The thermally conductive shock absorber 224 of the illustrated example is positioned within the cavity 206 and has a shape complementary to a shape of the vapor chamber 218. For example, the thermally conductive shock absorber 224 (e.g., the first side 224a) of the illustrated example has a surface area that is substantially similar to (e.g., within 10%) of a surface area provided by the vapor chamber 218 (e.g., the first side 214a of the vapor chamber 218). In other words, a length and a width that is substantially equal to (e.g., within a 10% variation of) a length and a width of the vapor chamber 218. Providing a surface area similar to (e.g., identical to) the surface area of the vapor chamber 218 improves heat transfer efficiency. In some examples, the thermally conductive shock absorber 224 of the illustrated example can have a length extending between the first side wall 102a and the second side wall 102b of the housing 102 and a width extending between the third side wall 102c and the fourth side wall 102d of the housing 102. In some examples, the thermally conductive shock absorber 224 of the illustrated example can have a length and/or a width that is smaller than a length and/or a width of the housing 102, the skin 204 (e.g., the first side 204a of the skin 204) and/or the vapor chamber 218 (e.g., the first side 214a of the vapor chamber 218). In some examples, a surface area of (e.g., the first side 224a of) the thermally conductive shock absorber 224 can be less than a surface area (e.g., of the first side 214a) of the vapor chamber 218 and/or the skin 204 (e.g., the first side 204a) of the skin 204. In some examples, the thermally conductive shock absorber 224 of the illustrated example can be any size relative to the vapor chamber 218 and/or the skin 204. In some examples, the thermally conductive shock absorber 224 of the illustrated example can be sized substantially similar to a size of the vapor chamber 218 and/or may be positioned only in areas aligned with the hardware components 208.

The thermally conductive shock absorber 224 of the illustrated example includes a shock absorbing body 230 (e.g., a shock absorbing material or a shock absorber) and a thermal conductive material 232 (e.g., a thermal conductive layer, a sheet, etc.). The shock absorbing body 230 of the illustrated example is a body made of an impact absorbing material (e.g., shock absorbing material(s)). For example, the shock absorbing body 230 of the illustrated example is a body that can be made of rubber, silicone, urethane, an elastomeric material, and/or any other suitable yielding material to absorb impact forces. For example, the impact absorbing material can be a jelly and/or liquid sealed within the thermal conductive material 232. The shock absorbing body 230 resiliently deforms, flexes, or deflects to absorb energy or impact forces during an impact event. For example, the shock absorbing body 230 absorbs impact forces when the electronic device 100 is dropped to protect against damage to the hardware components 208 (e.g., the processor 212, the PCB 210, the vapor chamber 218, etc.). Thus, the shock absorbing body 230 provides an energy sink in load path. After absorbing the impact, the shock absorbing body 230 of the illustrated example has resilient characteristics and returns to its initial position (e.g., a non-deformed or non-flexed position).

To define a thermally conductive cooling pathway between the vapor chamber 218 and the skin 204, the electronic device 100, the thermally conductive shock absorber 224 of the illustrated example includes the thermal conductive material 232. The thermal conductive material 232 of the illustrated example is a first sheet 232a (e.g., an upper sheet) that defines the first side 224a of the thermally conductive shock absorber 224 and is in direct contact with the first side 214a of the vapor chamber 218 and a second sheet 232b (e.g., a lower sheet) that defines the second side 224b of the thermally conductive shock absorber 224 and is in direct contact with the first side 204a of the skin 204. The thermal conductive material 232 of the illustrated is in contact with at least a portion of the shock absorbing body 230. In the illustrated example, the thermal conductive material 232 encases or wraps around (e.g., completely encloses) the shock absorbing body 230 such that the shock absorbing body 230 is fully positioned within the thermal conductive material 232. The thermal conductive material 232 includes ends 232c, 232d that couple the first sheet 232a and the second sheet 232b. For example, the first sheet 232a, the second sheet 232b and the ends 232c, 232d wrap around the shock absorbing body 230. In other words, the thermal conductive material 232 is a continuous sheet that provides a continuous heat transfer pathway from the vapor chamber 218 to the skin 204 and/or housing 102.

The thermally conductive shock absorber 224 of the illustrated example can have a thickness of approximately between 0.5 millimeters and 1 millimeter. For example, the shock absorbing body 230 can have a thickness that is approximately between 0.3 millimeters and 0.7 millimeters. Each of the first sheet 323a and the second sheet 232b of the thermal conductive material 232 can have a thickness approximately between 0.1 millimeters and 0.3 millimeters. The thermal conductive material 232 of the illustrated is formed as a tube that is crushed or compressed after the shock absorbing body 230 is positioned in the tube. The thermal conductive material 232 of the illustrated example is composed of graphite (e.g., a single layer of graphite, multiple folded layers of graphite, a foil, etc.). However, in other examples, the thermal conductive material 232 can be copper, aluminum, a copper foil, an aluminum foil, a graphite foil, a sheet, a layer, a combination thereof, and/or any other suitable heat conductive material(s). In some examples, the thermal conductive material 232 can be a combination of copper, graphite, aluminum and/or any other combination or suitable material(s). When the thermal conductive material 232 is a foil, the thermal conductive material 232 can be wrapped around the shock absorbing body 230 to encircle the shock absorbing body 230.

In operation, the thermal conductive material 232 provides a passive cooling system or heat sink. For example, heat generated by the hardware components 208 of the illustrated example is dissipated (e.g., spread) across the surface area of the vapor chamber 218. For example, heat generated by the processor 212 is absorbed and dissipated across the vapor chamber 218. The vapor chamber 218 is structured to dissipate heat from the first side 214a of the vapor chamber 218 to the second side 214b of the vapor chamber 218. The thermal conductive material 232 transfers the heat from the second side 214b of the vapor chamber 218 to the housing 102. Specifically, heat transfers from the first sheet 232a and to the second sheet 232b via the ends 232c, 232d. The heat then transfers to the skin 204 via the second sheet 232b and to the frame 202 via the ends 232c, 232d, where it dissipates from the housing 102.

FIG. 3 is another example electronic device having an example cooling system disclosed herein. Many of the components of the example electronic device 300 of FIG. 3 are substantially similar or identical to the components described above in connection with FIGS. 1 and 2. As such, those components will not be described in detail again below. Instead, the interested reader is referred to the above corresponding descriptions for a complete written description of the structure and operation of such components. To facilitate this process, similar or identical reference numbers will be used for like structures in FIG. 3 as used in FIGS. 1-2. For example, the electronic device 300 includes a housing 102, a display 104, a frame 202, a skin 204, hardware components 208 (e.g., electronic components, a PCB 210, a processor 212, graphic card, memory, a camera, a speaker, a microphone, etc.) a vapor chamber 218) that are constructed substantially similar to the electronic device 100 of FIGS. 1 and 2.

Referring to FIG. 3, the electronic device 300 includes another example thermal management system 302 disclosed herein. The thermal management system 302 of the illustrated example includes a plurality of thermally conductive shock absorbers 304 (e.g., passive cooling and impact resistant units). The thermally conductive shock absorbers 304 are positioned between the vapor chamber 218 and the skin 204 and define a heat transfer pathway to transfer heat from the vapor chamber 218 to the housing 102 (e.g., the skin 204). Specifically, the thermally conductive shock absorbers 304 of the illustrated example are spaced throughout the housing 102.

Each of the thermally conductive shock absorbers 304 of the illustrated example includes a shock absorbing body 306 and a thermal conductive material 308 (e.g., a layer, a sheet, a foil, etc.). The thermal conductive material 308 encloses the shock absorbing body 306. The shock absorbing body 306 is a shock absorber composed of, for example, rubber, silicone, a jelly, a liquid, and/or other impact absorbing material(s). The thermal conductive material 308 of the illustrated example can be composed of graphite, copper, aluminum, any combination thereof, and/or any other suitable thermally conductive material(s). In some examples, the shock absorbing body 306 and the thermal conductive material 308 of the illustrated example can be composed or formed similar to the shock absorbing body 230 and the thermal conductive material 232 of FIG. 2, but formed with a smaller dimensional footprint.

To define a heat load pathway from the vapor chamber 218 to the skin 204, the thermal conductive material 232 of the thermally conductive shock absorbers 304 of the illustrated example directly engage the vapor chamber 218 and the skin 204. Additionally, to reduce (e.g. prevent) hotspots on the housing 102 (e.g., the skin 204), the thermally conductive shock absorbers 304 are spaced apart relative to each other to provide spaces or airgaps 310 therebetween. In this manner, the airgaps 310 act as insulation to resist heat transfer from the vapor chamber 218 to the skin 204 via the airgaps 310.

In operation, heat generated by the processor 212 is spread via the vapor chamber 218. The thermal conductive material 308 of the thermally conductive shock absorbers 304 transfer heat from the vapor chamber 218 to the housing 102 (e.g., the skin 204). Each of the thermally conductive shock absorbers 304 provide a continuous pathway for transferring heat from the vapor chamber 218 to the housing 102. In contrast, the airgaps 310 restrict (e.g., prevent) heat transfer from the vapor chamber 218 to the skin 204 via the airgaps 310. In this manner, heat transferred from the vapor chamber 218 to the housing 102 is (e.g., only, or directly) channeled through the thermal conductive material 232 of the thermally conductive shock absorbers 304. As a result, the airgaps 310 restrict (e.g., prevent) occurrence of hotspots on the skin 204. For example, the processor 212 typically generates the most amount of heat during operation and the airgap 310 directly underneath the processor 212 restricts or prevents the portion of the skin 204 in alignment (e.g., vertical alignment) with the airgap 310 and the processor 212 from having a temperature that is greater than a portion of the skin 204 spaced away from the processor 212. By distributing the heat to portions of the skin 204 associated with the thermally conductive shock absorbers 304, heat transferred to the skin 204 can be more evenly distributed across the skin 204 to reduce (e.g., prevent) occurrence of hotspots on the housing 102. In other words, heat transferred from the thermal conductive material 308 in direct contact with the skin 204 transfers laterally to cooler portions of the skin 204 directly aligned with the airgaps 310.

Figure 4:
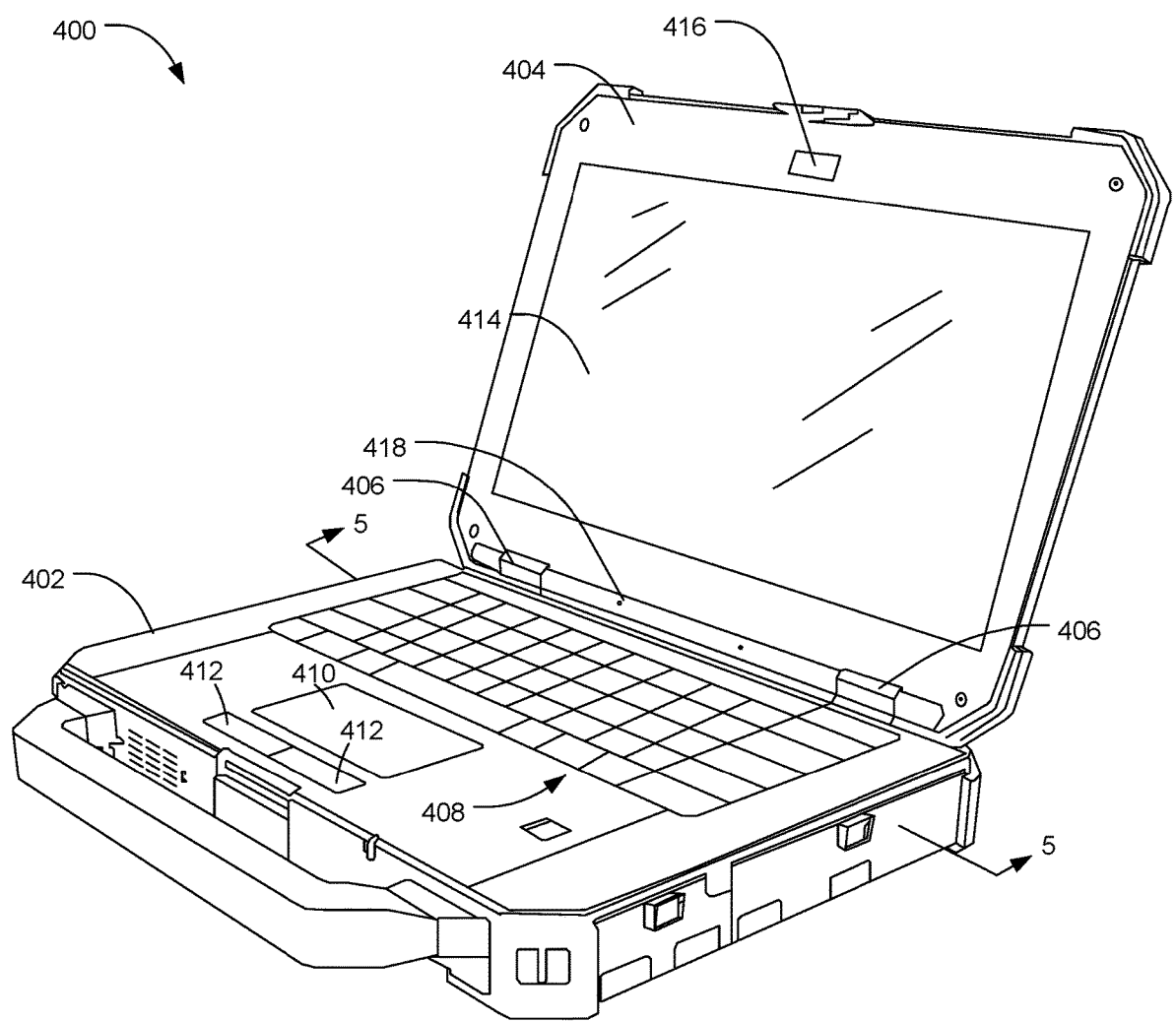
FIG. 4 is an example electronic device having another example thermal management system disclosed herein.

FIG. 4 is another example electronic device 400 disclosed herein. The electronic device 400 of the illustrated example is a mobile computer (e.g., a rugged laptop, a laptop, etc.). The electronic device 400 of the illustrated example includes a first housing 402 coupled to a second housing 404 via a hinge 406. The hinge 406 enables the second housing 404 to rotate or fold relative to first housing 402 between a stored position (e.g., where the second housing 404 is aligned or parallel with the first housing 402) and an open position as shown in FIG. 4 (e.g., where the second housing 404 is non-parallel relative to the first housing 402). In the open position, the second housing 404 can rotate relative to the first housing 402 about the hinge 406 to a desired viewing angle. The first housing 402 of the illustrated example includes a keyboard 408, a track pad 410 and input keys 412. The second housing 404 carries a display 414, a camera 416 and a speaker 418.

FIG. 5 is a cross-sectional view of the example electronic device 400 taken along line 4-4 of FIG. 4. The electronic device 400 of the illustrated example includes another example thermal management system 500 disclosed herein to dissipate heat generated in the first housing 402. In some examples, the second housing 404 can include the thermal management system 500 to dissipate heat generated within the second housing 404 by, for example, the display 414.

The first housing 402 of the illustrated example defines a frame 502 (e.g., chassis) having side walls 504 and a support surface 506. The frame 502 of the illustrated example is single piece structure. The frame 502 of the of the illustrated example defines a cavity 508 to carry the hardware components 208 and the thermal management system 500. The support surface 506 of the illustrated example is oriented toward the cavity 508. The hardware components 208 of the illustrated example include a PCB 210 and a processor 212. The PCB 210 and the processor 212 are positioned underneath the keyboard 408. The thermal management system 500 of the illustrated example includes a vapor chamber 218 and a thermally conductive shock absorber 510. The thermally conductive shock absorber 510 is positioned between the vapor chamber 218 and the support surface 506 of the first housing 402.

The thermally conductive shock absorber 510 of the illustrated example includes a plurality of shock absorbing bodies 512 and a thermal conductive material 514. The shock absorbing bodies 512 of the illustrated example are shock absorbing materials or shock absorbing bodies. The shock absorbing bodies 512 are made of impact absorbing material(s) such as, for example, rubber, silicone, jelly, and/or any suitable material(s).

The shock absorbing bodies 512 of the illustrated example include a first set 516 (e.g. first row) of the shock absorbing bodies 512 and a second set 518 (e.g., a second row) of the shock absorbing bodies 512. In particular, the first set 516 of the shock absorbing bodies 512 are oriented in a first orientation and the second set 518 of the shock absorbing bodies 512 are oriented in a second orientation opposite the first orientation. In particular, the first set 516 of the shock absorbing bodies 512 and the second set 518 of the shock absorbing bodies 512 are positioned in an alternating relationship. Specifically, the first set 516 of the shock absorbing bodies 512 is coupled (e.g., attached) to the vapor chamber 218 and the second set 518 of the shock absorbing bodies 512 is coupled (e.g., attached) to the support surface 506 of the first housing 402.

The shock absorbing bodies 512 each include a mounting surface 520 and a guide surface 522. The mounting surface 520 of the illustrated example is substantially planar (e.g., a substantially flat surface). For example, in the orientation of FIG. 5, the mounting surface 520 of the first set 516 of the shock absorbing bodies 512 is substantially parallel (e.g., almost parallel, exactly parallel, within 1 percent of perfectly parallel, etc.) to a second surface 218a of the vapor chamber 218 oriented toward the support surface 506, and the mounting surface 520 of the second set 518 of the shock absorbing bodies 512 is substantially parallel (e.g., almost parallel, exactly parallel, within 1 percent of perfectly parallel, etc.) relative to an inner surface 506a of the support surface 506 oriented toward the vapor chamber 218. For example, the mounting surface 520 of the first set 516 of the shock absorbing bodies 512 (e.g., directly) couples or attaches to the second surface 218b of the vapor chamber 218 and the mounting surface 520 of the second set 518 of the shock absorbing bodies 512 (e.g., directly) couples or attaches to the inner surface 506a of the support surface 506.

For example, the mounting surface 520 is permanently deformed to provide the planar surface and the guide surface 522 elastically deforms to absorb forces during an impact event.

The guide surface 522 of the illustrated example has an arcuate surface. For example, the guide surface 522 is a semi-circular shape (e.g., a half-circle) that protrudes away from the mounting surface 520. As discussed below, a radius of the guide surface 522 of the illustrated example is dependent on a bending radius of the thermal conductive material. Specifically, the radius of the guide surface 522 is greater than the bending radius of the thermal conductive material 514.

Additionally, the shock absorbing bodies 512 each include an airgap 524 The airgap 524 of the illustrated example can be defined by a cutout, an opening, a channel, etc. The airgap 524 of the illustrated example acts as insulation to reduce (e.g., restrict or prevent) heat conduction through the shock absorbing bodies 512. Additionally, the airgap 524 formed in the shock absorbing bodies 512 improves (e.g., increases) flexibility characteristics of the shock absorbing bodies 512 (e.g., of the guide surface 522). In some examples, the airgap 524 of the shock absorbing bodies 512 of the illustrated example can be filled with jelly, liquid and/or any other impact absorbing material(s), an insulation material, any combination thereof, and/or any other suitable impact absorbing material(s) and/or thermally non-conductive material(s).

The thermal conductive material 514 of the illustrated example is positioned between the first set 516 of the shock absorbing bodies 512 and the second set 518 of the shock absorbing bodies 512. For example, the shock absorbing bodies 512 do not directly engage each other because the thermal conductive material 514 is positioned between the shock absorbing bodies 512. The thermal conductive material 514 at least partially surrounds (e.g., partially wraps around) the shock absorbing bodies 512. Specifically, the thermal conductive material 514 of the illustrated example wraps around at least portions of the guide surface 522 of the shock absorbing bodies 512. To enable the thermal conductive material 514 to at least partially contact (e.g., directly contact or at least partially wrap around) the shock absorbing bodies 512 (e.g., arcuate or curved surfaces of the shock absorbing bodies 512), the thermal conductive material 514 of the illustrated example has an arcuate or wave-like shape (e.g., a sinusoidal wave shape). The thermal conductive material 514 of the illustrated example has alternating waves 526 that engage (e.g., directly engage) at least portions of the vapor chamber 218 and portions of the support surface 506. For example, the waves 526 of the thermal conductive material 514 of the illustrated example that at least partially wrap around the guide surface 522 of the first set 516 of the shock absorbing bodies 512 at least partially engage the support surface 506. In some examples, the first set 516 of the shock absorbing bodies 512 causes portions of the thermal conductive material 514 to engage support surface 506.

Similarly, the waves 526 of the thermal conductive material 514 of the illustrated example that at least partially contact or wrap around the guide surface 522 (e.g., a curved or arcuate surface) of the second set 518 of the shock absorbing bodies 512 at least partially engage (e.g., directly engage) the vapor chamber 218. The waves 526 of the thermal conductive material 514 have shapes that are similar or complementary to the shape of the guide surface 522 of the shock absorbing bodies 512. In some examples, the second set 518 of the shock absorbing bodies 512 causes portions of the thermal conductive material 514 to engage the vapor chamber 218. The thermal conductive material 514 of the illustrated example is a continuous strip of material.

To vary (e.g., increase or decrease) a heat transfer rate of the thermal conductive material 514, a bending radius of the waves 526 and/or a thickness 528 of the thermal conductive material 514 can be varied (e.g., increased or decreased). Additionally, a number of direct engagements (e.g., the waves 526) of the thermal conductive material 514 with the vapor chamber 218 and the support surface 506 can vary the heat transfer rate. For example, the greater the number of direct engagements (e.g., waves 526), the greater the heat transfer rate, and vice versa. The thermal conductive material 514 can be a layer, a sheet, a foil, etc., and can be made of aluminum, graphite, copper, a combination thereof, and/or any other suitable thermal conductive material(s).

In operation, the thermal conductive material 514 promotes heat transfer between the vapor chamber 218 and the frame 502. For example, heat generated by the hardware components 208 is spread by the vapor chamber 218 across a surface area of the vapor chamber 218. The heat transfers through the vapor chamber 218 towards the waves 526 of the thermal conductive material 514 that are in direct contact with the vapor chamber 218. The airgaps 524 of the shock absorbing bodies 512 restrict heat transfer through the shock absorbing bodies 512 and thereby reduce (e.g., prevent) hotspots from forming on portions of the support surface 506 that are not directly engaged by the thermal conductive material 514. The heat transfers from the waves 526 of the thermal conductive material 514 in direct contact with the vapor chamber 218 to the waves 526 of the thermal conductive material 514 in direct contact with the support surface 506. The heat then dissipates away from the support surface 506 and/or dissipates laterally (e.g., in a direction between the side walls 504) across the support surface 506. During an impact event (e.g., when the electronic device is dropped from a height of, for example, 2 to 3 feet), the shock absorbing bodies 512 absorb the impact load and restrict impact forces from imparting to the hardware components 208. In some examples, the guide surface 522 flexes or bends towards the mounting surface 520 during impact (e.g., to absorb the forces) and returns to its initial position (e.g., deflects to the position shown in FIG. 5) after the impact event.

FIG. 6 is another example electronic device 600 having another example thermal management system 602 disclosed herein. Many of the components of the example electronic device 600 of FIG. 6 are substantially similar or identical to the components described above in connection with FIG. 5. As such, those components will not be described in detail again below. Instead, the interested reader is referred to the above corresponding descriptions for a complete written description of the structure and operation of such components. To facilitate this process, similar or identical reference numbers will be used for like structures in FIG. 6 as used in FIGS. 1-5. For example, the electronic device 600 includes a first housing 402, a keyboard 408, hardware components 208 (e.g., a PCB 210, a processor 212, a vapor chamber 218) a frame 502, side walls 504, a support surface 506, a thermal conductive material 514 that are constructed substantially similar to the electronic device 400 of FIG. 5.

Referring to FIG. 6, the thermal management system 602 of the illustrated example includes a thermally conductive shock absorber 604. The thermally conductive shock absorber 604 of the illustrated example includes a plurality of shock absorbing bodies 606 (e.g., a shock absorber) and a thermal conductive material 514. The shock absorbing bodies 606 of the illustrated example have a solid body composed of an impact absorbing material including, but not limited to, rubber, silicon, jelly a combination thereof, and/or any other suitable yielding material(s). In other words, the shock absorbing bodies 606 of the illustrated example are substantially similar to the shock absorbing bodies 512 of FIG. 5 except that the shock absorbing bodies 606 of the illustrated example do not have the airgaps 524. Thus, the shock absorbing bodies 606 of the illustrated example have a perimeter profile that is substantially similar to the perimeter profile of the shock absorbing bodies 512 of FIG. 5. For example, the shock absorbing bodies 606 each include a mounting surface 610 and a guiding surface 612.

The shock absorbing bodies 606 of the illustrated example include a first set 614 (e.g. first row) of the shock absorbing bodies 606 and a second set 616 (e.g., a second row) of the shock absorbing bodies 606. In particular, the first set 614 of the shock absorbing bodies 606 is oriented in a first orientation and the second set 616 of the shock absorbing bodies 606 is oriented in a second orientation opposite the first orientation. Specifically, the first set 614 of the shock absorbing bodies 606 is coupled (e.g., attached) to the vapor chamber 218 and the second set 616 of the shock absorbing bodies 606 is coupled (e.g., attached) to the support surface 506 of the first housing 402. The shock absorbing bodies 606 of the illustrated example can dissipate a greater amount of force than the shock absorbing bodies 512 of FIG. 5.

Figure 7:
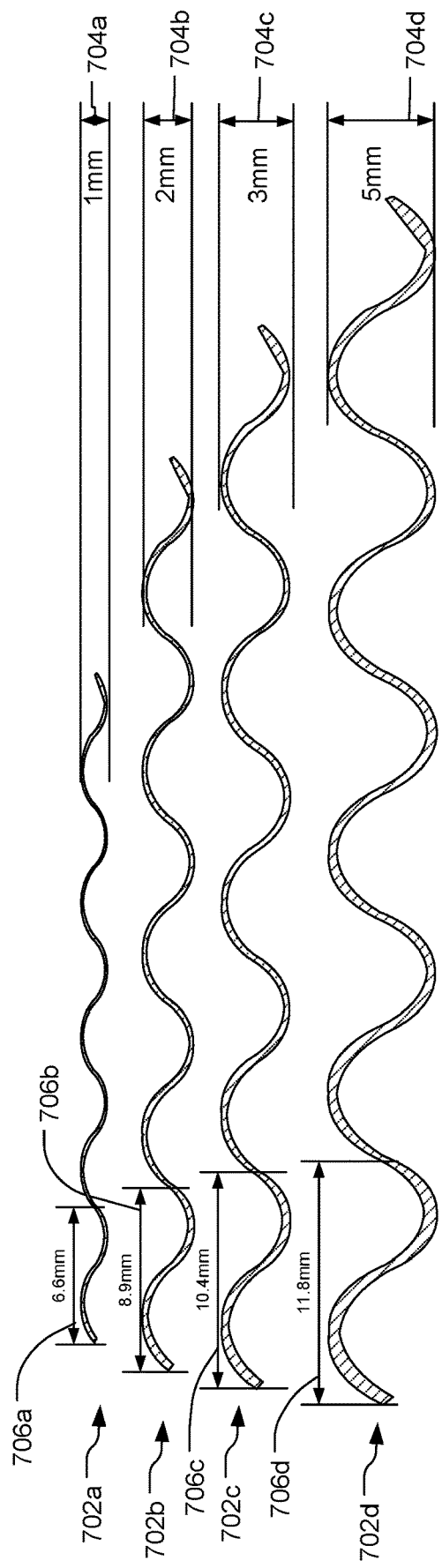
FIG. 7 is a schematic illustration of different thermal conductive materials that can implement example thermal management systems disclosed herein.

FIG. 7 is a schematic illustration of thermal conductive materials 702a-702d that can be used to implement the example thermal management systems 500 and 602 of FIGS. 4-6. FIG. 7 illustrates a relationship of a height 704a-704d, a pitch 706a-706d, and a count (e.g., 5 waves) for a bending radius of the thermal conductive materials 702a-702d fixed at three (R=3).

Figure 8:
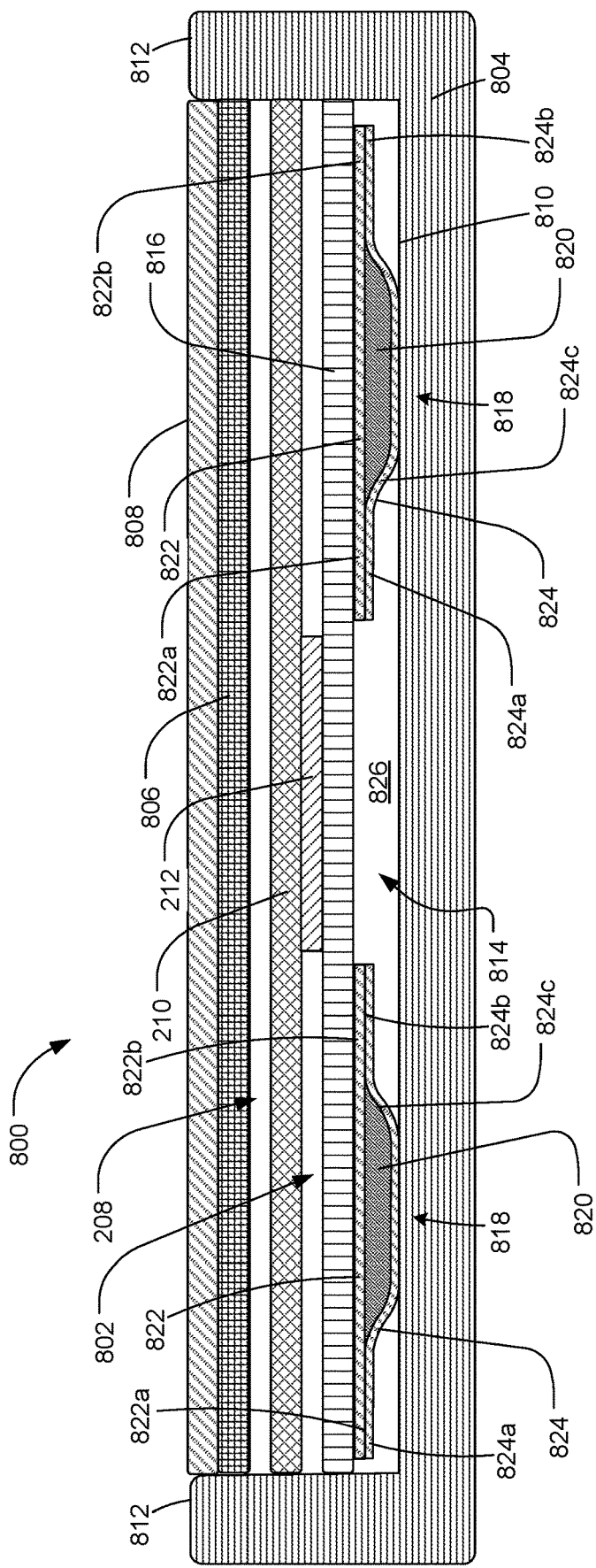
FIG. 8 illustrates another example electronic device having another example thermal management system disclosed herein.

FIG. 8 is a cross-sectional view of another example electronic device 800 having another example thermal management system 802 disclosed herein. The example electronic device 800 of the illustrated example can be a tablet, a display portion of a laptop (e.g., the second housing 404 of FIG. 4), and/or any other suitable electronic device. The electronic device 800 of the illustrated example has a frame 804 (e.g., a chassis). The frame 804 of the illustrated example carries a display 806 and a cover 808 (e.g., a glass cover). The frame 804 of the illustrated example includes a support surface 810 and side walls 812 that define a cavity 814 to house or receive hardware components 208 (e.g., a PCB 210, a processor 212, etc.) of the electronic device 800.

The thermal management system 802 of the illustrated example includes a heat sink or a heat spreader 816 and a plurality of thermally conductive shock absorbers 818. The heat spreader 816 of the illustrated example is a plate or block of material having high thermal conductivity. For example, the heat spreader 816 of the illustrated example can be made of copper, aluminum, diamond, and/or any thermally conductive material(s). In other examples, thermal management system 802 can use a vapor chamber, a heat sink, and/or any other heat spreader(s) to dissipate or spread heat generated by the hardware components 208. The thermally conductive shock absorbers 818 are positioned between the heat spreader 816 and the support surface 810 of the frame 804.

The thermally conductive shock absorbers 818 of the illustrated example each include a shock absorbing body 820 (e.g., a shock absorber) positioned between a first thermal conductive material 822 (e.g., a layer, a sheet, etc.) and a second thermal conductive material 824 (e.g., a layer, a sheet, etc.). The first thermal conductive material 822 of the thermally conductive shock absorbers 818 is directly coupled to the heat spreader 816 and the second thermal conductive material 824 of the thermally conductive shock absorbers 818 is directly coupled to the support surface 810. To provide a continuous heat pathway between the heat spreader 816 and the support surface 810, the first thermal conductive material 822 is directly coupled to the second thermal conductive material 824. Specifically, respective ends 822a, 822b of the first thermal conductive material 822 are directly engaged with respective ends 824a, 824b of the second thermal conductive material 824. In some examples, the respective ends 822a, 822b of the first thermal conductive material 822 can be coupled to the respective ends 824a, 824b of the second thermal conductive material 824 via fasteners (e.g., pins, rivets, screws), conductive adhesive, crimping, twisting, and/or any other fastener(s) or manufacturing technique(s) to provide a thermal conductive pathway between the first thermal conductive material 822 and the second thermal conductive material 824.

The shock absorbing body 820 of the illustrated example can be an impact absorbing material including, but not limited to, rubber, silicone, jelly, liquid, a combination thereof, and/or any other yielding material(s) for absorbing impact forces. Respective ones of the first thermal conductive material 822 and the second thermal conductive material 824 of the illustrated example can be sheets of materials, a folded sheet of material, graphite layers or folded graphite layers, copper, layers of aluminum, a combination thereof, and/or any other thermal conductive material(s).

Additionally, the shock absorbing body 820 of the illustrated example has a trapezoidal cross-sectional shape. The second thermal conductive material 824 is at least partially contoured to matably engage the shock absorbing body 820. In other words, a portion 824c of the second thermal conductive material 824 between the respective ends 824a, 824b has a shape complementary to a shape of the shock absorbing body 820 to enable the second thermal conductive material 824 to at least partially contact or wrap around the shock absorbing body 820. An arcuate portion 820a of the shock absorbing body 820 of the illustrated example has a radius that is greater a minimum required bending radius needed for shaping the second thermal conductive material 824 complementary to the shock absorbing body 820. In some examples, the shock absorbing body 820 can have any suitable shape.

The thermally conductive shock absorbers 818 of the illustrated example are positioned between the heat spreader 816 and the support surface 810. Additionally, a first thermally conductive shock absorber 818a is spaced from a second thermally conductive shock absorber 818b to provide an airgap 826 underneath the processor 212.

In operation, heat generated by the hardware components 208 (e.g., the processor 212) is spread across a surface of the heat spreader 816. The heat transfers to the first thermal conductive material 822 of the thermally conductive shock absorbers 818 that is in direct contact with the heat spreader 816 and transfers to the second thermal conductive material 824 of the thermally conductive shock absorbers 818 via the connection provided by the respective ends 822a-b and 824a-b. The heat transfers to the support surface 810 via the direct contact between the second thermal conductive material 824 of the thermally conductive shock absorbers 818 and the support surface 810. The airgap 826, which is aligned with the processor 212 and provides an insulation against thermal heat transfer, reduces (e.g., prevent) hotspots from forming on the support surface 810 during operation.

The shock absorbing body 820 of the illustrated example absorb impact forces during a drop event (e.g., a drop between six inches and 5 feet).

Figure 9:
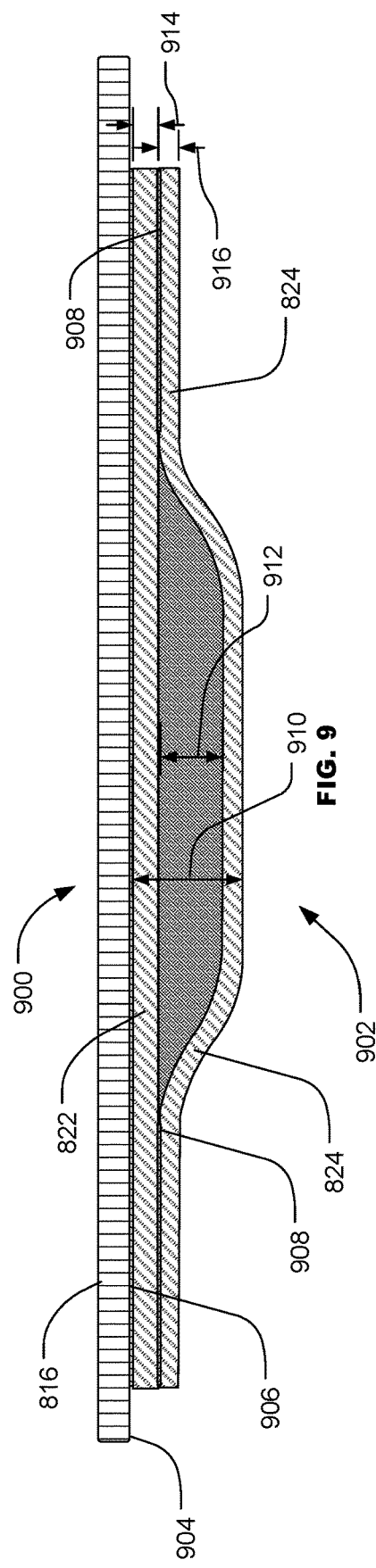
FIG. 9 is a cross-sectional view of an example thermal management system disclosed herein.

FIG. 9 is another example thermal management system 900 disclosed herein. The thermal management system 900 of the illustrated example can be used with the electronic devices 100, 400, 600, 700 and 800 disclosed herein and/or any other electronic device(s). The thermal management system 900 of the illustrated example is a pre-assembled unit or assembly cartridge that can facilitate assembly of an electronic device. In some examples, the thermal management system 900 can retrofit existing electronic devices.

Many of the components of the example thermal management system 900 of FIG. 9 are substantially similar or identical to the components described above in connection with FIG. 8. As such, those components will not be described in detail again below. Instead, the interested reader is referred to the above corresponding descriptions for a complete written description of the structure and operation of such components. To facilitate this process, similar or identical reference numbers will be used for like structures in FIG. 9 as used in FIG. 8. For example, the thermal management system 900 includes a heat spreader 816, a shock absorbing body 820, a first thermal conductive material 822, and a second thermal conductive material 824 that are constructed substantially similar to the thermal management system 802 of FIG. 8.

The thermal management system 900 of FIG. 9 includes a thermally conductive shock absorber 902 (e.g., a passive cooling and impact resistant assembly) coupled to the heat spreader 816. The thermally conductive shock absorber 902 includes the shock absorbing body 820 positioned between the first thermal conductive material 822 and the second thermal conductive material 824. The first thermal conductive material 822 of the illustrated example is coupled to a first surface 904 of the heat spreader 816 via a first conductive adhesive layer 906. Likewise, the second thermal conductive material 824 is attached to the first thermal conductive material 822 via a second thermal conductive adhesive layer 908. In some examples, the first thermal conductive material 822 couples to the heat spreader 816 via fasteners, chemical fasteners (e.g., glue), welding, and/or any other fastener(s) and/or manufacturing technique(s). In some examples, the second thermal conductive material 824 couples to the first thermal conductive material 822 via fasteners, chemical fasteners (e.g., glue), welding, and/or any other fastener(s) and/or manufacturing technique(s).

The thermally conductive shock absorber 902 of the illustrated example has an overall height 910. The overall height 910 of the illustrated example is determined based on a thickness 912 of the shock absorbing body 820, a thickness 914 of the first thermal conductive material 822, and a thickness 916 of the second thermal conductive material 824. The overall height 910 can vary to adjust (e.g., increase or decrease) an impact absorbing characteristic of the shock absorbing body 820 and/or a heat transfer rate of the first thermal conductive material 822 and/or the second thermal conductive material 824. For example, the overall height 910 can be between approximately 1 micron and 500 microns. In some examples, the thickness 912 of the shock absorber can be between 10 microns and 300 microns. In some examples, the thickness 912 of the first thermal conductive material 822 and/or the thickness 914 of the second thermal conductive material 824 can be between 1 micron and 50 microns.

FIG. 10A is another example electronic device 1000 disclosed herein. FIG. 10B is a partially exploded view of the example electronic device 1000 of FIG. 10A. Referring to FIGS. 10A and 10B, the electronic device 1000 of the illustrated example includes another example thermal management system 1002 disclosed herein. The electronic device 1000 of the illustrated example is a desktop computer such as, for example, a NUC extreme compute element manufactured by Intel® Corporation. In some examples, the electronic device 1000 of the illustrated example can be a mobile device (e.g., a cell phone, a smart phone, a tablet, etc.), a server, a modular compute system, a graphic calculator, and/or any other electronic device.

The electronic device of the illustrated example includes a primary frame 1004 (e.g., chassis) that defines a cavity 1006 to receive hardware components 1008. In FIG. 10B, the hardware components are showed removed from the primary frame 1004. The hardware components 1008 are cantilevered from a secondary frame 1010 (e.g., a handle portion). The hardware components 1008 of the illustrated example include a printed circuit board, a processor, memory, a graphics card, an antenna, a power source and/or any other hardware components used with electronic devices.

The thermal management system 1002 of the illustrated example includes thermally conductive shock absorbers 1012. The thermally conductive shock absorbers 1012 of the illustrated example extend between a first end 1004*a* of the primary frame 1004 and a second end 1004*b* of the primary frame 1004, and between a first side edge 1004*c* of the primary frame 1004 and a second side edge 1004*d* of the primary frame 1004. Although not shown, in some examples, the thermal management system 1002 can include a vapor chamber and/or a heat spreader positioned on the thermally conductive shock absorbers 1012 and/or carried by hardware components 1008 of the electronic device 1000.

FIG. 10C is a perspective view of an example thermally conductive shock absorber 1014 representative of the example thermally conductive shock absorbers 1012 of FIG. 10B. The thermally conductive shock absorber 1014 of the illustrated example includes a shock absorbing body 1016 (e.g., a shock absorber) and a thermal conductive material 1018. The shock absorbing body 1016 of the illustrated example is a body 1020 having a cylindrical shape (e.g., a circular cross-sectional shape) and a longitudinal length 1022. The shock absorbing body 1016 of the illustrated example is a solid body made of a shock absorbing or impact absorbing material(s) including, but limited to, rubber, silicone, jelly and/or any other suitable material(s). In some examples, the shock absorbing body 1016 can include an airgap (e.g., a bore or opening) extending (e.g., in the longitudinal direction) through at least a portion of the body 1020. The thermal conductive material 1018 of the illustrated example at least partially wraps around the shock absorbing body 1016 such that the thermal conductive material 1018 establishes a heat transfer pathway between the hardware components 1008 and the frame 1004 when the electronic device 1000 is in the assembled view of FIG. 10A and the electronic device is in an operating condition. The thermal conductive material 1018 of the illustrated example forms a tube or cylinder to receive the shock absorbing body 1016.

In some examples, the hardware components 208, the PCB 210, and/or processor 212 disclosed herein provides means for processing instructions (e.g., calculations, logical comparisons, data, etc.). In some examples, the housing 102, 402, 404 and/or the housing 102, the frame 502, the frame 804, primary frame 1004 provide means for housing the means for processing and/or means for housing the hardware components 208, the PCB 210, the processor 212, the thermal management systems 200, 302, 500, 602, 802, 900, 1002, etc. In some examples, the vapor chamber 218, the heat spreader 816, a heat sink, and/or other suitable heat spreaders provides means for spreading heat. In some examples, the shock absorbing body(ies) 230, 306, 512, 606, 820, 1016 provides the means for absorbing a shock from an impact. In some examples, the thermal conductive material 232, 308, 514, 702*a-d*, first thermal conductive material 822, the second thermal conductive material 824, and/or the thermal conductive material 1018 provide means for transferring heat.

The foregoing examples of the electronic devices 100, 300, 400, 600, 800 and 1000, the thermal management systems 200, 302, 500, 602, 802, 900, 1002, the thermally conductive shock absorbers 224, 304, 510, 604, 818, 902, 1012, 1014 improve passive heat transfer rates and provide impact resistance. For example, the thermally conductive shock absorber body(ies) 224, 304, 510, 604, 818, 902, 1012, 1014 can provide approximately between a 25% and a 75% stress reduction. For example, a simulation drop of an electronic device from a height of 1 meter on concrete, the electronic device having a 0.6 millimeter thick outer cover, a 0.20 millimeter thick graphite thermal conductive layer, and 0.4 millimeter jelly shock absorbing material(s) and 0.2 millimeter outer cover provided a 67 percent stress reduction compared to the same electronic device without the graphite layer and the jelly shock absorbing material(s). In some examples, the thermally conductive shock absorbers 224, 304, 510, 604, 818, 902, 1012, 1014 disclosed herein reduce a deflection of a housing, chassis and/or cover (e.g., the housing 102, 402, 404, the frame 202, 502, 804, 1004, the skin 204, the support surface 506, the cover 808, etc.) by approximately between 50% and 80%. For example, a force of 30 Newtons applied by a pogo pin having a 10 inch diameter to an electronic device that did not include the thermally conductive shock absorber(s) 224, 304, 510, 604, 818, 902, 1012, 1014 disclosed herein caused a cover deflection of 0.9333 millimeters. A force of 30 Newtons applied by a pogo pin having a 10 inch diameter to an electronic device that included the thermally conductive shock absorber(s) 224, 304, 510, 604, 818, 902, 1012, 1014 disclosed herein caused a cover deflection of 0.318 millimeters, a 68 percent decrease. Thus, the example thermally conductive shock absorber(s) 224, 304, 510, 604, 818, 902, 1012, 1014 disclosed herein provide an effective, low cost thermal management and impact resistant solution for electronic devices.

The foregoing examples of the electronic devices 100, 300, 400, 600, 800 and 1000, the thermal management systems 200, 302, 500, 602, 802, 900, 1002, the thermally conductive shock absorbers 224, 304, 510, 604, 818, 902, 1012, 1014 and/or other components disclosed herein can be employed with an electronic device, a thermal management system, or a thermally conductive shock absorber(s). Although each example the electronic device 100, 300, 400, 600, 800 and 1000, the thermal management system 200, 302, 500, 602, 802, 900, 1002, the thermally conductive shock absorber(s) 224, 304, 510, 604, 818, 902, 1012, 1014 and/or other components disclosed above have certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Example methods, apparatus, systems, and articles of manufacture to analyze computer system attack mechanisms are disclosed herein. Further examples and combinations thereof include the following:

Example 1 includes an electronic device including a housing and a hardware component positioned inside the housing. A thermally conductive shock absorber is located between an inner surface of the housing and the hardware component. The thermally conductive shock absorber including an impact absorbing material and a thermal conductive material being in contact with at least a portion of the impact absorbing material.

Example 2 includes the electronic device of example 1, where the impact absorbing material is made of at least one of silicone or rubber.

Example 3 includes the electronic device of example 2, where the thermal conductive material includes graphite.

Example 4 includes the electronic device of example 1, further including a vapor chamber positioned between thermally conductive shock absorber and the hardware component.

Example 5 includes the electronic device of example 4, where a first side of the thermal conductive material directly engages the vapor chamber and a second side of the thermal conductive material opposite the first side directly engages the housing.

Example 6 includes the electronic device of example 1, further including a plurality of thermally conductive shock absorbers.

Example 7 includes the electronic device of example 6, where the thermally conductive shock absorbers are spaced apart within the housing.

Example 8 includes an electronic device including a chassis, a processor, a printed circuit board, a heat sink, a shock absorbing body, and a thermal conductive material having a first surface to at least partially engage the heat sink and a second surface to at least partially engage the chassis. The thermal conductive material to transfer heat from the heat sink to the chassis, the thermal conductive material to at least partially wrap around the shock absorbing body Example 9 includes the electronic device of example 8, wherein the thermal conductive material includes a first sheet defining the first surface and a second sheet defining the second surface.

Example 10 includes the electronic device of example 9, where the first sheet is coupled to the second sheet to define a cavity, the cavity to receive the shock absorbing body.

Example 11 includes the electronic device of example 9, where the first sheet is directly attached to the heat sink via a thermal conductive adhesive Example 12 includes the electronic device of example 11, where the shock absorbing body is coupled to the first sheet, and the second sheet is coupled to the shock absorbing body.

Example 13 includes the electronic device of example 12, where the second sheet is coupled to the chassis.

Example 14 includes the electronic device of example 9, where at least a portion of the first sheet engages at least a portion of the second sheet to enable heat transfer from the heat sink to the chassis.

Example 15 includes the electronic device of example 8, where the shock absorbing body includes a plurality of shock absorbing bodies spaced apart and located between the heat sink and the chassis.

Example 16 includes the electronic device of example 15, where the plurality of shock absorbing bodies include a first set of shock absorbing bodies positioned in a first orientation and a second set of shock absorbing bodies positioned in a second orientation opposite the first orientation, the first set of shock absorbing bodies and the second set of shock absorbing bodies being positioned in an alternating relationship.

Example 17 includes the electronic device of example 16, where the thermal conductive material is positioned between the first set of the shock absorbing bodies and the second set of the shock absorbing bodies.

Example 18 includes the electronic device of example 17, where the first set of the shock absorbing bodies is to cause portions of the thermal conductive material to engage the heat sink and the second set of the shock absorbing bodies is to cause portions of the thermal conductive material to engage the chassis, the thermal conductive material to promote heat transfer between the heat sink and the chassis.

Example 19 includes an electronic device including means for processing instructions, means for housing the means for processing instructions, means for spreading heat from the means for processing instructions, means for absorbing shock from an impact, and means for transferring heat at least partially wrapped around the means for absorbing shock. The means for transferring heat and the means for absorbing shock being positioned between the means for spreading heat to the means for housing.

Example 20 includes the electronic device of example 19, where means for transferring heat transfers heat from the means for spreading heat to the means for housing.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An electronic device comprising:
 a housing;
 a hardware component positioned inside the housing;
 a thermally conductive shock absorber located between an inner surface of the housing and the hardware component, the thermally conductive shock absorber including:
 an impact absorbing body, the impact absorbing body having an arcuate surface and a planar surface to define a cavity; and
 a thermal conductive material in contact with at least a portion of the arcuate surface of the impact absorbing body.

2. The electronic device as defined in claim 1, wherein the impact absorbing body includes at least one of silicone or rubber.

3. The electronic device as defined in claim 2, wherein the thermal conductive material includes graphite.

4. The electronic device as defined in claim 1, further comprising a vapor chamber positioned between the thermally conductive shock absorber and the hardware component.

5. The electronic device as defined in claim 4, wherein a first side of the thermal conductive material directly engages the vapor chamber and a second side of the thermal conductive material opposite the first side directly engages the housing.

6. The electronic device as defined in claim 1, wherein the thermally conductive shock absorber is a first thermally conductive shock absorber, and further including a plurality of thermally conductive shock absorbers, the first thermally conductive shock absorber included in the plurality of thermally conductive shock absorbers.

7. The electronic device as defined in claim 6, wherein the plurality of thermally conductive shock absorbers are spaced apart within the housing.

8. The electronic device as defined in claim 1, wherein the cavity is filled with air.

9. An electronic device comprising:
   a chassis;
   a processor;
   a printed circuit board;
   a heat sink;
   a plurality of shock absorbing bodies spaced apart and located between the heat sink and the chassis, the plurality of shock absorbing bodies respectively including an arcuate portion and a planar portion, the arcuate portions of a first set of the shock absorbing bodies in a first orientation and the arcuate portions of a second set of the shock absorbing bodies in a second orientation opposite the first orientation, the arcuate portions of the first set of the shock absorbing bodies and the arcuate portions of the second set of the shock absorbing bodies positioned in an alternating relationship; and
   a thermal conductive material having a first surface to at least partially engage the heat sink and a second surface to at least partially engage the chassis, the thermal conductive material to transfer heat from the heat sink to the chassis, the thermal conductive material to at least partially wrap around respective ones of the arcuate portions of the first set of the shock absorbing bodies and respective ones of the arcuate portion of the second set of shock absorbing bodies.

10. The electronic device as defined in claim 9, wherein the thermal conductive material is a sheet between a first one of the first set of the shock absorbing bodies and a second one of the second set of the shock absorbing bodies.

11. The electronic device as defined in claim 9, wherein the thermal conductive material is between the first set of the shock absorbing bodies and the second set of the shock absorbing bodies.

12. The electronic device as defined in claim 11, wherein the first set of the shock absorbing bodies is to cause portions of the thermal conductive material to engage the heat sink and the second set of the shock absorbing bodies is to cause portions of the thermal conductive material to engage the chassis, the thermal conductive material to promote heat transfer between the heat sink and the chassis.

13. An electronic device comprising:
   means for processing instructions;
   means for housing the means for processing instructions;
   means for spreading heat from the means for processing instructions;
   means for absorbing shock from an impact; and
   means for transferring heat, the means for transferring heat including a planar and an arcuate surface that fully enclose the means for absorbing shock, the means for transferring heat and the means for absorbing shock between the means for spreading heat and the means for housing.

14. The electronic device as defined in claim 13, wherein the means for transferring heat transfers heat from the means for spreading heat to the means for housing.

15. The electronic device as defined in claim 13, wherein the means for transferring heat includes a first sheet coupled to a second sheet to define a cavity to receive the means for absorbing shock.

16. The electronic device as defined in claim 15, wherein the first sheet is attached to the means for spreading heat via a thermal conductive adhesive.

17. The electronic device as defined in claim 16, wherein the means for absorbing shock is coupled to the first sheet, and the second sheet is coupled to the means for absorbing shock.

18. The electronic device as defined in claim 17, wherein the second sheet is coupled to the means for housing.

19. The electronic device as defined in claim 18, wherein at least a portion of the first sheet engages at least a portion of the second sheet to enable heat transfer from the means for spreading heat to the means for housing.

20. The electronic device as defined in claim 13, wherein the means for spreading heat includes a first surface area and the means for absorbing shock includes a second surface area, the second surface area being substantially similar to the first surface.

* * * * *